US006664790B2

(12) United States Patent
Cook et al.

(10) Patent No.: US 6,664,790 B2
(45) Date of Patent: Dec. 16, 2003

(54) AUTOMATED DIAGNOSTIC TESTER FOR HID LAMP LUMINAIRES

(75) Inventors: John F. Cook, Hendersonville, NC (US); Byron R. Collins, Tuxedo, NC (US); George E. Keifer, Hendersonville, NC (US)

(73) Assignee: General Electric Company, Schenectady, NY (US)

( * ) Notice: Subject to any disclaimer, the term of this patent is extended or adjusted under 35 U.S.C. 154(b) by 11 days.

(21) Appl. No.: 09/683,420

(22) Filed: Dec. 27, 2001

(65) Prior Publication Data

US 2002/0084784 A1 Jul. 4, 2002

Related U.S. Application Data

(60) Provisional application No. 60/258,988, filed on Dec. 29, 2000.

(51) Int. Cl.[7] .......................... G01R 31/00; H05B 37/04
(52) U.S. Cl. ........................................ 324/414; 315/129
(58) Field of Search .................................. 324/414, 404, 324/133; 315/129, 131, 134

(56) References Cited

U.S. PATENT DOCUMENTS

| 5,557,207 A | 9/1996 | Duve ........................ 324/414 |
| 5,986,412 A | 11/1999 | Collins ...................... 315/291 |
| 6,087,834 A | 7/2000 | Tury et al. .................. 324/414 |
| 6,097,191 A | 8/2000 | Jones, Jr. ................... 324/414 |

OTHER PUBLICATIONS

Citations from nerac.com for *Serious Information* Copyright 2000, NERAC Inc., Jun. 30, 2000.
*Starting Pulse Tester For High Pressure Sodium Systems* by B.R. Collins and R.E. Wenner, presented at Annual IES Conference, Jul. 13–17, 1975, San Francisco, California.

*Primary Examiner*—John E. Chapman
*Assistant Examiner*—James Kerveros
(74) *Attorney, Agent, or Firm*—Fay, Sharpe, Fagan, Minnich & McKee, LLP

(57) ABSTRACT

In an embodiment of the present invention, an automated diagnostic tester system is configured for use with a lighting fixture connected to a power source and including at least one of a ballast connected to the power source, a capacitor connected to the ballast, an ignitor, and a high intensity discharge lamp connected to the ballast. The tester system includes an electrical connector system capable of being interconnected as part of the lighting fixture, providing circuit access at least to the power source and to the high intensity discharge lamp. This enables interruption of at least one of (i) the connection of the ballast to the power source and (ii) the connection of the high intensity discharge lamp to the ballast. An automated diagnostic tester is connected to the electrical connector system and is operable to automatically measure lighting fixture parameters including at least at one of power source voltage, ballast open circuit output voltage, ballast output current, ignitor pulse voltage and lamp operating voltage.

21 Claims, 8 Drawing Sheets

AUTOMATED DIAGNOSTIC TESTER FOR HID LAMP LUMINAIRES

CROSS REFERENCE TO RELATED APPLICATIONS

This application claims the benefit of Provisional U.S. Patent Application Ser. No. 60/258,988, which was filed on Dec. 29, 2000.

BACKGROUND OF INVENTION

This invention relates to lamp fixtures or luminaires and particularly to diagnostic testing of high intensity discharge lamp lighting fixtures or luminaires.

High intensity discharge (HID) lamps, such as high pressure sodium lamps, mercury vapor lamps and metal halide lamps and others, are employed in a wide variety of applications including sports lighting, industrial lighting, and street lighting. In addition to the lamp itself, a luminaire may include several other components, including a ballast, a capacitor, an ignitor, and a photoelectric control.

The process of diagnosing and repairing a defective lighting fixture can be problematic and expensive. A typical current practice is to replace parts, regardless of whether they are faulty, until the lamp operates. Another current practice is for a troubleshooter to make measurements with a simple meter, and then make a judgment concerning which component or components are faulty, and should be replaced. Various forms of diagnostic tester have also been proposed, such as are disclosed in Tury et al U.S. Pat. No. 6,087,834 and Jones, Jr. U.S. Pat. No. 6,097,191. The approach as disclosed in these patents, however, requires a certain level of training and knowledge for effective troubleshooting. Moreover, such troubleshooting often must be carried out in the field, often employing a boom truck, rather than in a bench test environment.

SUMMARY OF INVENTION

In an embodiment of the present invention, an automated diagnostic tester system is configured for use with a lighting fixture connected to a power source and including at least one of a ballast connected to the power source, a capacitor connected to the ballast, an ignitor, and a high intensity discharge lamp connected to the ballast. The tester system includes an electrical connector system included as part of the lighting fixture, providing circuit access at least to the power source and to the high intensity discharge lamp. This enables interruption of at least one circuit connection selected from a group consisting of the connection of the ballast to the power source and the connection of the high intensity discharge lamp to the ballast. An automated diagnostic tester is connected to the electrical connector system and is operable to automatically measure lighting fixture parameters including at least at one of power source voltage, ballast open circuit output voltage, ballast output current, ignitor pulse voltage and lamp operating voltage.

DETAILED DESCRIPTION

Figure 1:
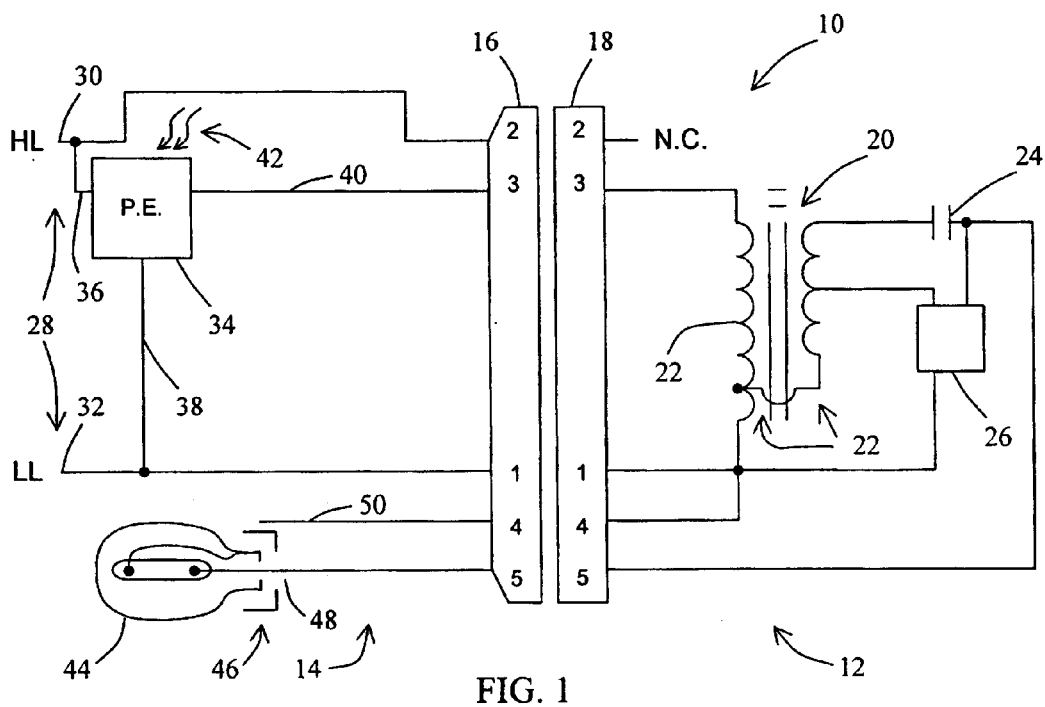
FIG. 1 is an electrical schematic circuit diagram of a lighting fixture that includes a photoelectric control.

Referring first to FIG. 1, illustrated is a modular lighting fixture 10 with which an automatic diagnostic tester of the present invention may be employed. Fixture 10 includes an electric component module 12, as well as additional fixture circuitry, generally designated 14, all physically mounted within a lighting fixture housing (not shown). The electric component module 12 and the additional fixture circuitry 14 are electrically connected together for operation by a pair of electrical connectors 16 and 18, which facilitate removal and replacement of the electric component module 72 as a unit. The electric component module 12, in addition to the electrical connector 18, includes a ballast circuit 20. The ballast circuit 20 shown is an auto-regulator type, but is representative of any one of a variety of conventional ballast circuits. The ballast circuit 20 includes ballast windings 22, a capacitor 24 connected to the ballast windings 22, and an ignitor 26.

The additional fixture circuitry 14 is powered by a power source 28 represented by high line (HL) conductor 30 and low line (LL) conductor 32. The power source 28 more generally includes conventional elements such as a utility transformer (not shown) and line fuses (not shown). The additional fixture circuitry 14 also includes a conventional photoelectric control 34 having input conductors 36 and 38 connected to HL and LL, respectively, as well as an output line 40. When daylight illumination as represented by symbol 42 is not present, the output line 40 is connected to HL via a switching element (not shown) internal to the photoelectric control 34. Finally, the additional fixture circuitry 14 includes a high intensity discharge lamp 44, such as but not limited to a mercury vapor lamp, a metal halide lamp or a high pressure sodium lamp, secured within a socket 46 having a socket "eye" conductor 48 and a socket "shell" conductor 50 electrically connected thereto.

Circuit connections are completed through the pair of electrical conductors 16 and 18 such that, in the absence of daylight illumination 42 when the photoelectric controller 34 is activated, high line (HL) voltage switched through the photoelectric controller 34 is conducted through pin pair 3,3 of the connectors 16 and 18 to the ballast 20, with the low line (LL) or common connection being completed through pin pair 1,1 of the electrical connectors 16 and 18. The output of the ballast 20 is conducted via pin pair 5,5 of the connectors 16 and 18 to the lamp socket "eye" conductor 48 and thus to the lamp 44, with the return circuit connection from the socket "shell" conductor 50 being completed through pin pair 4,4 of the connectors 16 and 18, and ultimately to the low line (LL), which serves as the common conductor.

In the particular lighting fixture 10 of FIG. 1, the connection of the high line (HL) conductor 30 through pin pair 2,2 of connectors 16 and 18 is not employed during normal operation of the lighting fixture 10. Rather, the connection to pin 2 of connector 16 is employed as a logic signal to indicate the presence of the photoelectric control 34 for purposes of automated diagnostic testing, as is described hereinbelow.

Figure 2:
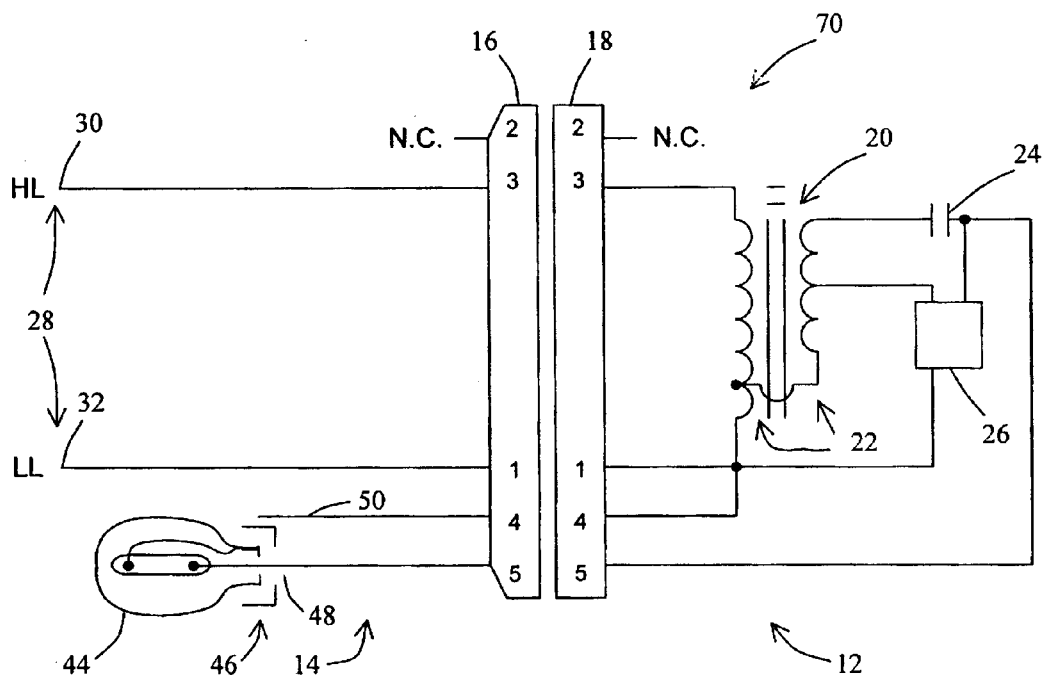
FIG. 2 is a similar electrical schematic circuit diagram of a lighting fixture that does not include a photoelectric control.

FIG. 2 is a schematic diagram of another lighting fixture 70, differing from the lighting fixture 10 of FIG. 1 in that the photoelectric control 34 of FIG. 1 is not present, and the power source 28 high line (HL) conductor 30 is connected directly to pin 3 of the electrical connector 16, thus directly supplying power to the ballast 20. The lighting fixture 70 of FIG. 2 is otherwise like that of the lighting fixture 10 of FIG. 1, and identical reference numerals are employed to designate corresponding elements.

Figure 3:
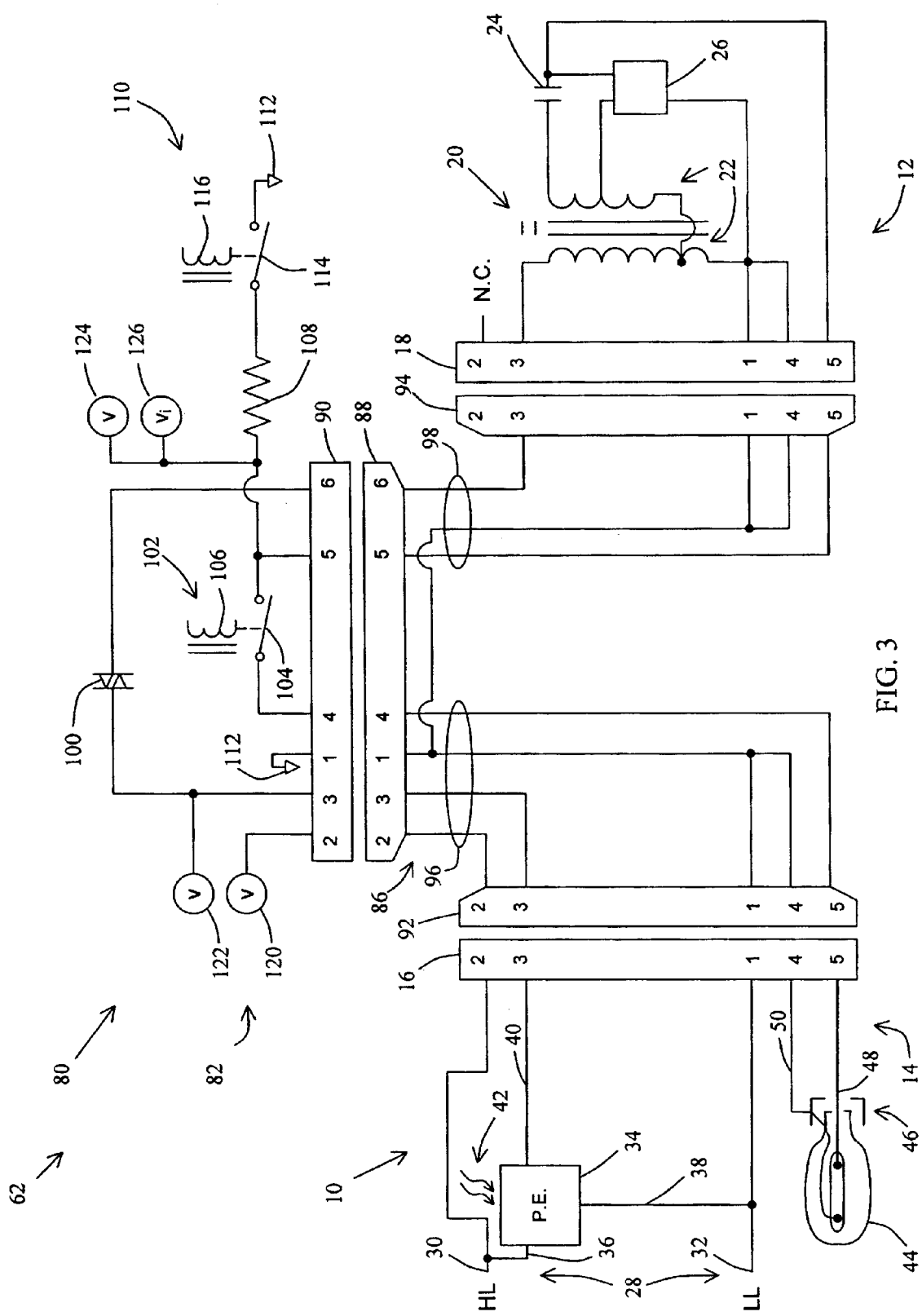
FIG. 3 is a simplified electrical schematic circuit diagram of a lighting fixture undergoing testing by an automated diagnostic tester system embodying the invention.

FIG. 3 is an electrical schematic diagram of one embodiment of an automatic diagnostic tester system 62 embodying concepts of the present invention, shown in combination with the fixture 10 of FIG. 1.

Figure 4:
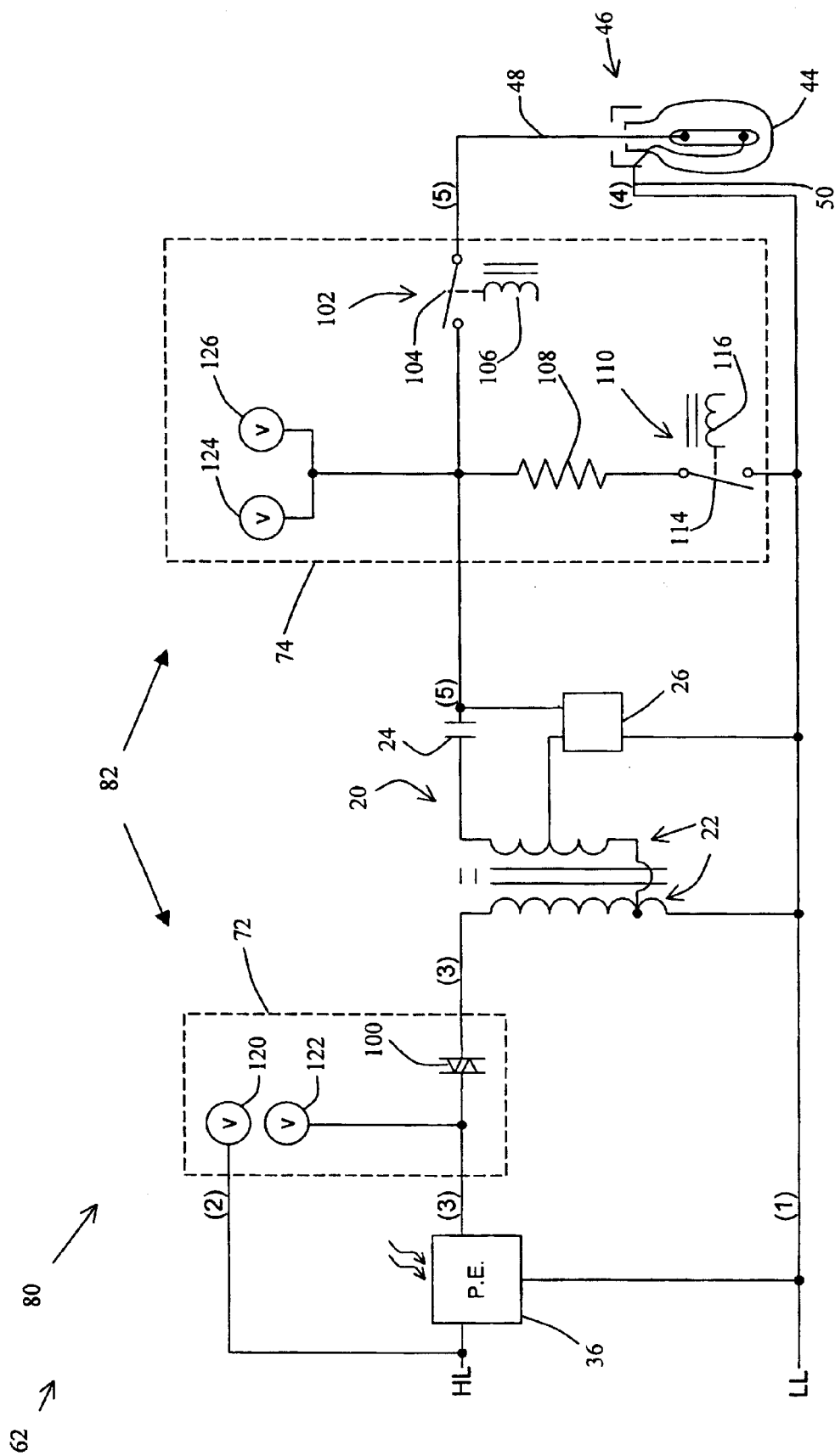
FIG. 4 is an electrical schematic circuit diagram corresponding to FIG. 3.

FIG. 4 is a corresponding schematic diagram of FIG. 3 where elements of the automatic diagnostic tester system 62 are in general drawn within dash line boxes 72 and 74, and elements of the fixture 10 are generally outside of boxes 72 and 74.

FIGS. 3 and 4 show both the electric component module 12 and the additional fixture circuitry 14, along with respective electrical connectors 16 and 18. In addition, there is an automated diagnostic tester 80, which includes test circuitry 82, as well as a cable assembly 86. The cable assembly 86 is typically adapted to a particular lighting fixture and, in the illustrated embodiment, takes the form of a "Y"-connected cable having one connector 88 connected to a mating connector 90 of the automated diagnostic tester 80, and a pair of cable connectors 92 and 94 for respective connection to the connectors 16 and 18. The cable assembly 86 has a pair of cable branches 96 and 98 respectively terminated by the connectors 92 and 94.

Figure 5:
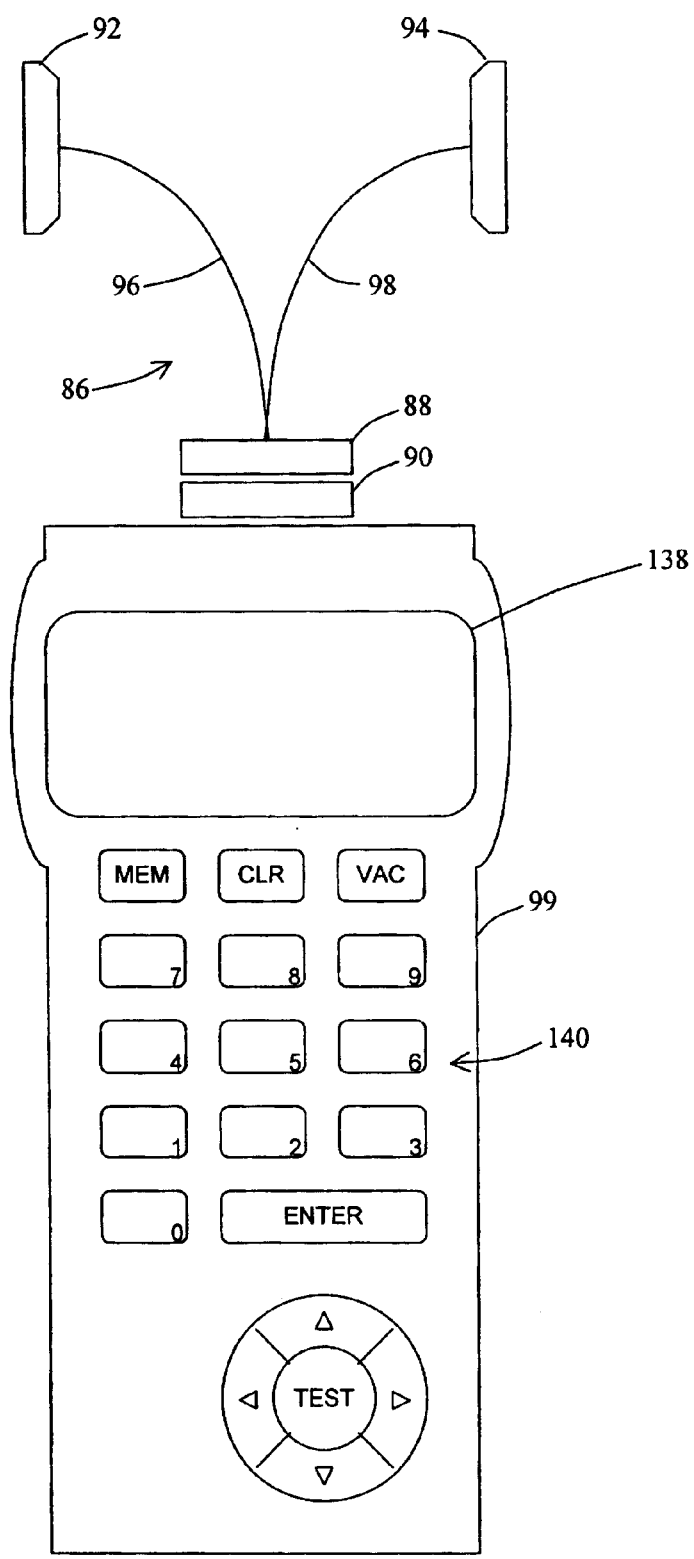
FIG. 5 is an external view of an automated diagnostic tester with cables attached.

FIG. 5 depicts an external view of a tester housing 99 which holds the automated diagnostic test circuitry 82, along with the connector and cabling assembly described above.

In other embodiments, a different connector arrangement may be employed. For example, most lighting fixtures do not have a separate electric component module such as the FIG. 1 module 12 removable as a unit, and the inherent connector pair 16, 18. In such cases, an equivalent connector pair can be provided as part of a wiring harness (not shown). Alternatively, a single test connector on the fixture may be provided, and a continuity plug (not shown) employed to complete the operational circuit when the automated diagnostic tester 80 is not plugged in.

The cable assembly 86 and the test circuitry portion 72, 74 of the automated diagnostic tester 80 together have the capabilities of both completing all required connections for operation of the lighting fixture 10, as well as for accessing appropriate circuit points for diagnostic testing.

Returning attention to FIGS. 3 and 4, the test circuitry 82 (e.g., the material within boxes 72, 74) thus includes a controlled switching element 700 in the exemplary form of a triac connected so as to enable controlled interruption of the circuit connection of the ballast winding 22 (pin 3 of connector 78) to the power source 28 as passed through the photoelectric control 34 (pin 3 of connector 16). Optionally, there is also included a controlled switching element 102 in the representative form of a relay, having relay contacts 104 and a relay coil 106. The relay 102 is electrically connected so as to enable controlled interruption of the connection of the HID lamp, specifically, the socket "eye" conductor 48 (pin 5 of connector 16) to the ballast 20 (pin 5 of connector 78).

In addition, for performing ballast current output tests, a load resistor 108 (for example 1–100 Ohms, although other resistance values may also be used), and a controlled switching element 110 in the exemplary form of a relay, are connected in series between the output of the ballast 20 (pin 5 of connector 18) and a circuit common point 112 which is connected to the power source low line (LL) 32 (pin 1 of connector 16). The relay 110 includes relay contact 114 and a coil 116. When the coil 116 is energized, the relay contact 114 closes, shunting the ballast output, and allowing the ballast circuit output current to be measured via voltage drop across the load resistor 108.

Inclusion of triac 100 is useful, as it allows the input voltage to the ballast 20 to be turned off while the relays 102 and 110 are switched, so these two relays are not required to switch current, only to withstand voltage.

In addition to selective circuit interruption capability, the test circuitry 82 includes the capability of measuring voltage at various points, as represented by voltage measurement points 120, 122, 124 and 126.

Thus, voltage measurement point 120 enables measurement of the voltage on pin 2 of connector 16. More particularly, voltage measurement point 120 enables logic determination whether voltage is actually present on pin 2 of connector 16. In the case of the FIG. 1 lighting fixture 10, the high line (HL) conductor 30 is connected to pin 2 of connector 16, thus logically indicating the presence of the photoelectric controller 34. In the case of the FIG. 2 lighting fixture 70, there is no connection to pin 2 of connector 16, and accordingly the voltage measurement point 120 would not measure any voltage when the test circuitry 80 is connected to the FIG. 2 lighting fixture 70.

The voltage measurement point 122 enables measurement of the voltage on pin 3 of connector 16. More particularly, voltage measurement point 122 enables measurement of the voltage of power source 28 as the output of the photoelectric controller 34, if present, as well as the functioning of the photoelectric controller 34, if present.

The voltage measurement point 124, connected to the output of ballast 20 via pin 5 of connector 18 enables measurement of both ballast open circuit output voltage and ballast output current (represented as voltage drop across load resistor 108).

Figure 6:
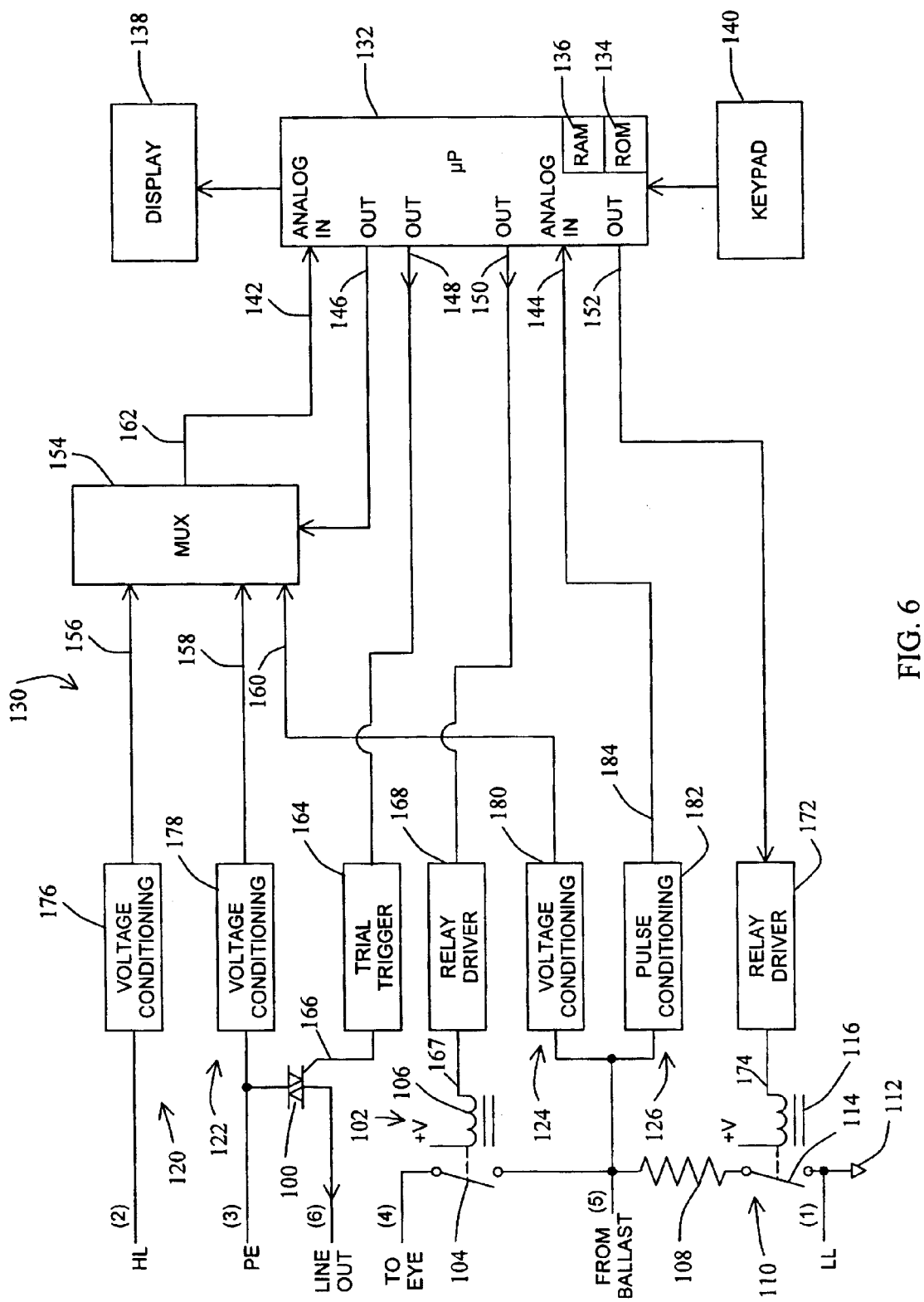
FIG. 6 is a simplified electrical schematic drawing of circuitry for the automated diagnostic tester, implemented using a microprocessor or microcontroller.

The final voltage measurement point 126, connected to the same point as the voltage measurement point 124 but employing different circuitry as is described hereinbelow with reference to FIG. 6, is for measuring peak pulse voltage during operation of the ignitor 26 to start the lamp 44.

With reference now to FIG. 6, shown in simplified block diagram form is a more complete version of test circuitry 730 included within the tester housing 99 (FIG. 5), including the test circuitry portion 82 shown in FIGS. 3 and 4. The circuitry of the diagnostic tester 80 is implemented in a conventional manner. The circuitry 130 is powered by a battery (not shown) internal to the tester housing 99, supplemented by a power supply circuit (not shown) which derives power through pin 3, when voltage is present. Along the left side of FIG. 6, the six lines conducted through the connectors 88 and 90 of FIG. 3 are designated by their pin numbers in parenthesis, as well as by descriptions.

The diagnostic tester 80 is microprocessor based. Accordingly, FIG. 6 test circuitry 130, including the test circuitry portions 72, 74 also shown in FIG. 3, includes a microcontroller 132 which, for example, may, in one embodiment, take the form of an appropriately programmed PIC 16C series processor or other appropriate device. The microcontroller 132 includes read-only program memory (ROM) 134, as well as random-access memory (RAM) 136 for use during execution. Representative programming stored within the microcontroller 132 program memory 134 is depicted in the flow charts of FIGS. 7–9, described hereinbelow. Connected to the microcontroller 132 in a conventional manner is a user display device 138, as well as a user input device in the form of a keypad 140 (although of course other input devices may also be used), both also shown in FIG. 5.

For measuring voltages, the microcontroller 132 includes representative analog inputs 142 and 144. The microcontroller 132 additionally includes digital outputs 146, 148, 150 and 152. The digital output 146 controls an analog multiplexer 154 having three analog inputs 156, 158 and 160, and an analog output 162 connected to the analog input 142 of the microcontroller 132.

In order to control interruption of the circuit connection of the ballast 20 to the power source 28, microcontroller 132 digital output 148 is connected through a triac triggering circuit 164 having an output 166 connected to the gate input of the triac 100. Similarly, microcontroller 132 output 150 is connected to a relay driver circuit 168. The relay driver 168 has an output 167 connected to drive the coil 106 of the relay 102. Digital output 152 is connected to another relay driver 172 having an output 174 connected to activate the coil 116 of the relay 110.

FIG. 3 voltage measurement points 120, 122 and 124 in FIG. 6 more particularly take the form of respective voltage conditioning circuits 176, 178 and 180, connected to respective inputs 156, 158 and 160 of the analog multiplexer 154. The microcontroller 132, under suitable program control, via the digital output 146 controlling the multiplexer 154 and the analog input 142 connected to the multiplexer 154 output 162 is accordingly enabled to sequentially measure the voltages at the indicated points.

The FIG. 3 voltage measurement point 126 in FIG. 6 more particularly comprises a pulse conditioning circuit 182 which determines the peak ignitor pulse voltage, and outputs a voltage signal proportional thereto on line 184 connected to the microcontroller 132 analog input 144.

The microcontroller 132 accordingly is able, under program control, to effect an automatic diagnostic testing procedure by appropriately activating the controlled switching elements 100, 102 and 110, and making voltage measurements at the points 120, 122, 124 and 126.

The automatic diagnostic tester system 62 embodying the invention has, in one embodiment, two general modes of operation. One mode is an intelligent diagnostic mode in which the automatic diagnostic tester system 62 automatically performs a sequence of tests, based on reference parameter values for a particular lighting fixture, and then logically determines what particular component is to be replaced. Diagnosis results are displayed on the user display 138. The other mode of operation is a measurement mode, during which the automatic diagnostic tester system 62 simply measures various actual parameters of a lighting fixture, and displays the results on the user display 138.

For diagnostic mode, the diagnostic tester system 62 compares measured parameter values with reference parameter values, and determines whether the measured values are within tolerance limits. The reference parameter values can be determined based on look-up tables stored within the memory of the microcontroller 132, and accessed via a fixture model number.

Another approach to providing reference parameter values, detailed below, is to input via the keypad 140 a code, printed on a label (not shown) affixed to the lighting fixture. The code is in effect a multi-parameter input, which implies the reference parameter values.

As one example, the input code may take the form of AABBCCCDEEF, where: AA represents the first two digits of the input line voltage; BB represents the first two digits of the lamp voltage; CCC represents the first three digits of the ballast open circuit voltage; D, which is a number from 1 to 5, represents an ignitor voltage range; EE represents the first two digits of the ballast current; and F is a number from 1 to 4 representing the type of ballast circuit.

More particularly, in one embodiment, the ballast type (F) is coded as 1 for a lag ballast; 2 for a reactor ballast; 3 for an auto-regulator ballast; and 4 for a magnetic regulator ballast.

The type of ballast also implies the tolerance range for the line voltage input. Thus, the line voltage tolerance for lag and reactor ballast circuits is ±5%, while the line voltage tolerance for auto-regulator and magnetic regulator ballast circuits is ±10%.

The line voltage (AA) is in any one of eight ranges (±5% or f 10%, depending on ballast type): 120 volts RMS, 208 volts RMS, 220 volts RMS, 230 volts RMS, 240 volts RMS, 277 volts RMS, 347 volts RMS or 480 volts RMS. Some lighting fixtures are manufactured for multivoltage operation, with the actual input voltage determination made at the time of installation by an installer who selects an appropriate one of several input leads connected to different voltage taps on the ballast. At the time of manufacture, it is not possible to specify the line voltage on the parameter input code. Accordingly the line voltage (AA) is coded as 00, and the diagnostic tester 80 prompts for a line voltage input via user keypad 140.

For lamp voltage (BB), eleven ranges are provided, each with a ±10% tolerance. The eleven ranges are 52 volts RMS, 55 volts RMS, 70 volts RMS, 90 volts RMS, 100 volts RMS, 120 volts RMS, 135 volts RMS, 200 volts RMS, 250 volts RMS, 262 volts RMS and 268 volts RMS.

For open circuit voltage (CCC) the tolerance is: L±10%. Reference voltage inputs can be from 120 volts RMS to 520 volts RMS.

The ignitor voltage reference parameter (D) denotes one of five ranges, in particular, 2500 to 4000 peak volts, 3000 to 4000 peak volts, 3000 to 5000 peak volts, 3300 to 4000 peak volts and 3500 to 4500 peak volts.

Ballast current (EE) is within the range of 1.0 amps RMS to 6.68 amps RMS, minimum. For each particular ballast current reference parameter value, the acceptable range is from the minimum specified to a maximum which is 1.5 times the minimum.

Figure 8:
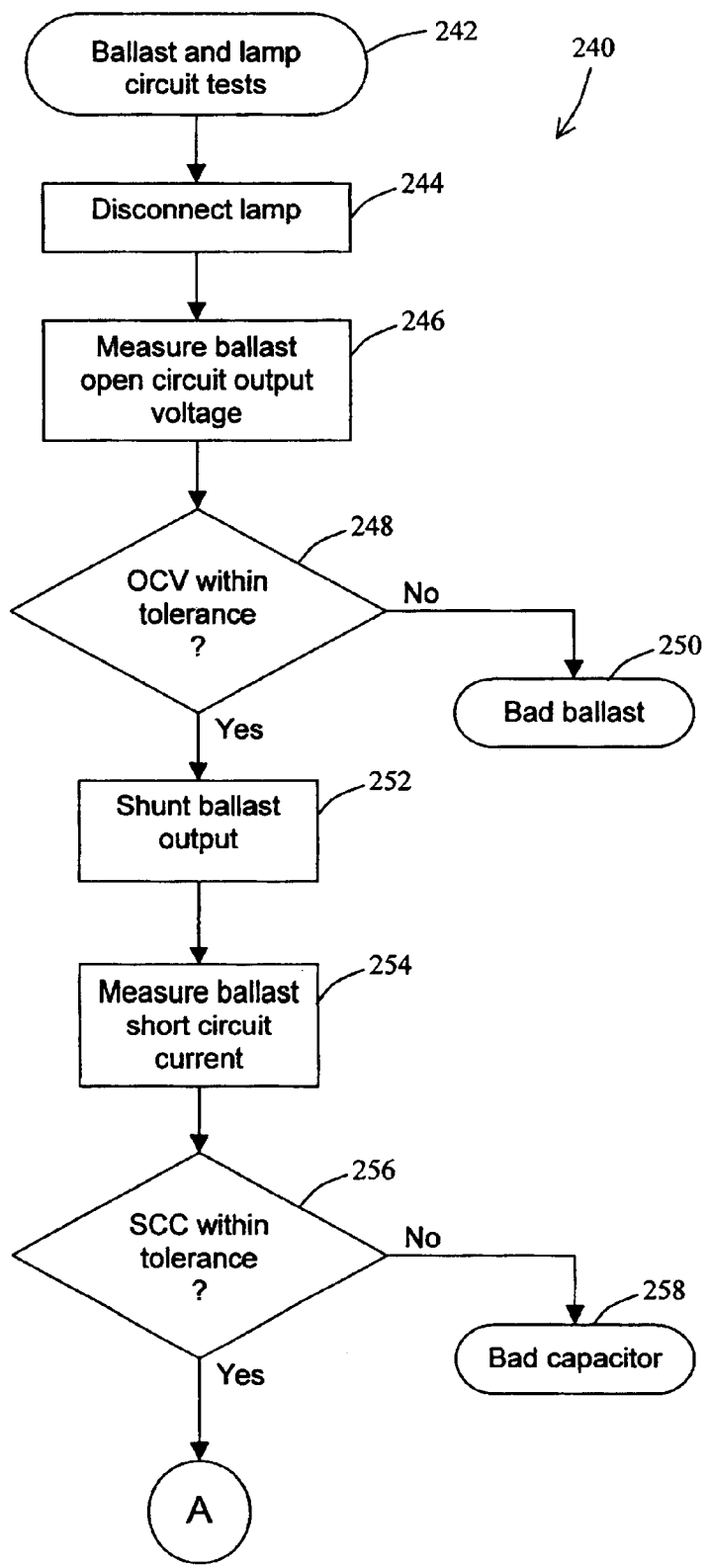
FIGS. 8 and 9 are another flow chart depicting programming within the microprocessor of FIG. 6.
Figure 9:
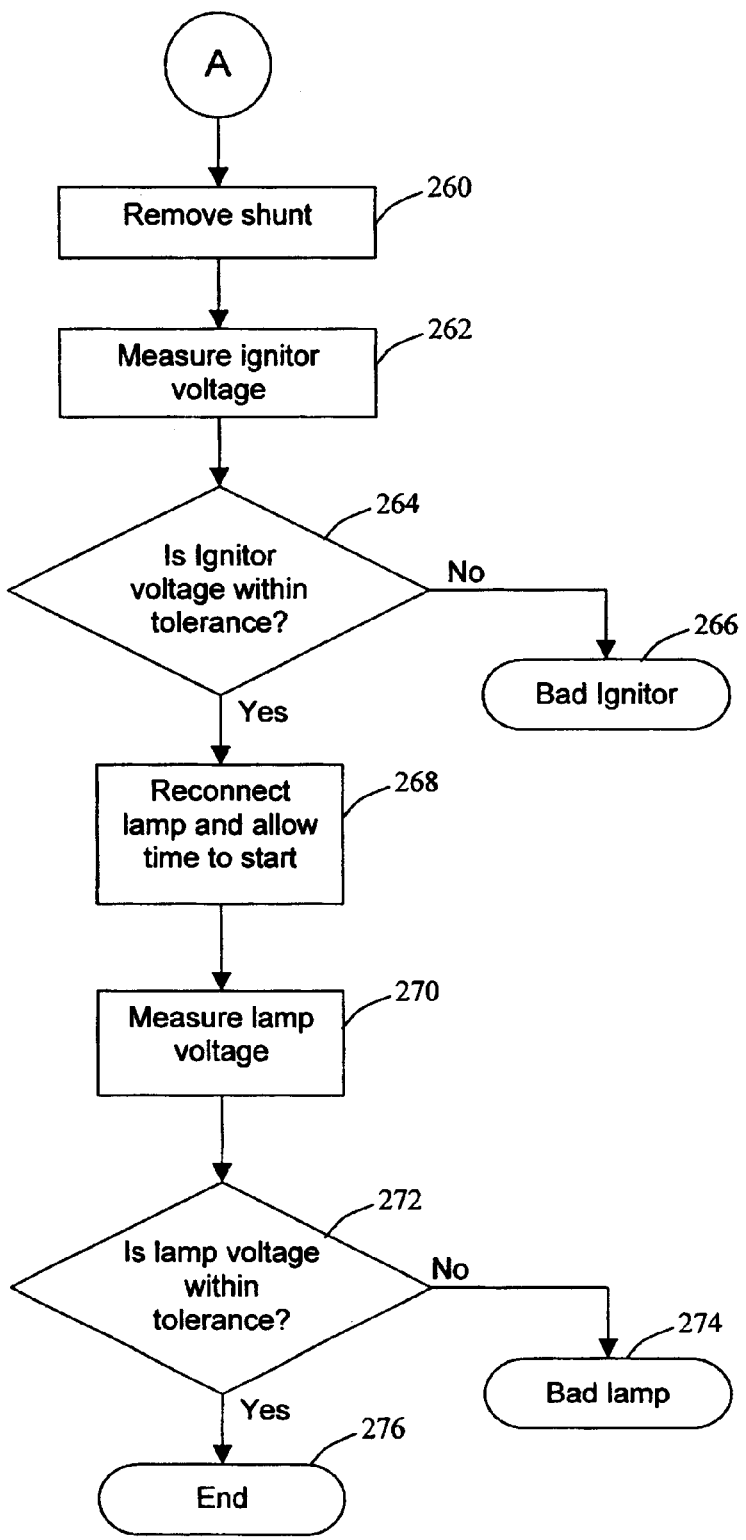

Various strategies may be employed for diagnosing a lighting fixture. Described hereinbelow with reference to the flow charts of FIGS. 7–9 is one approach, which will be understood to be exemplary only.

Figure 7:
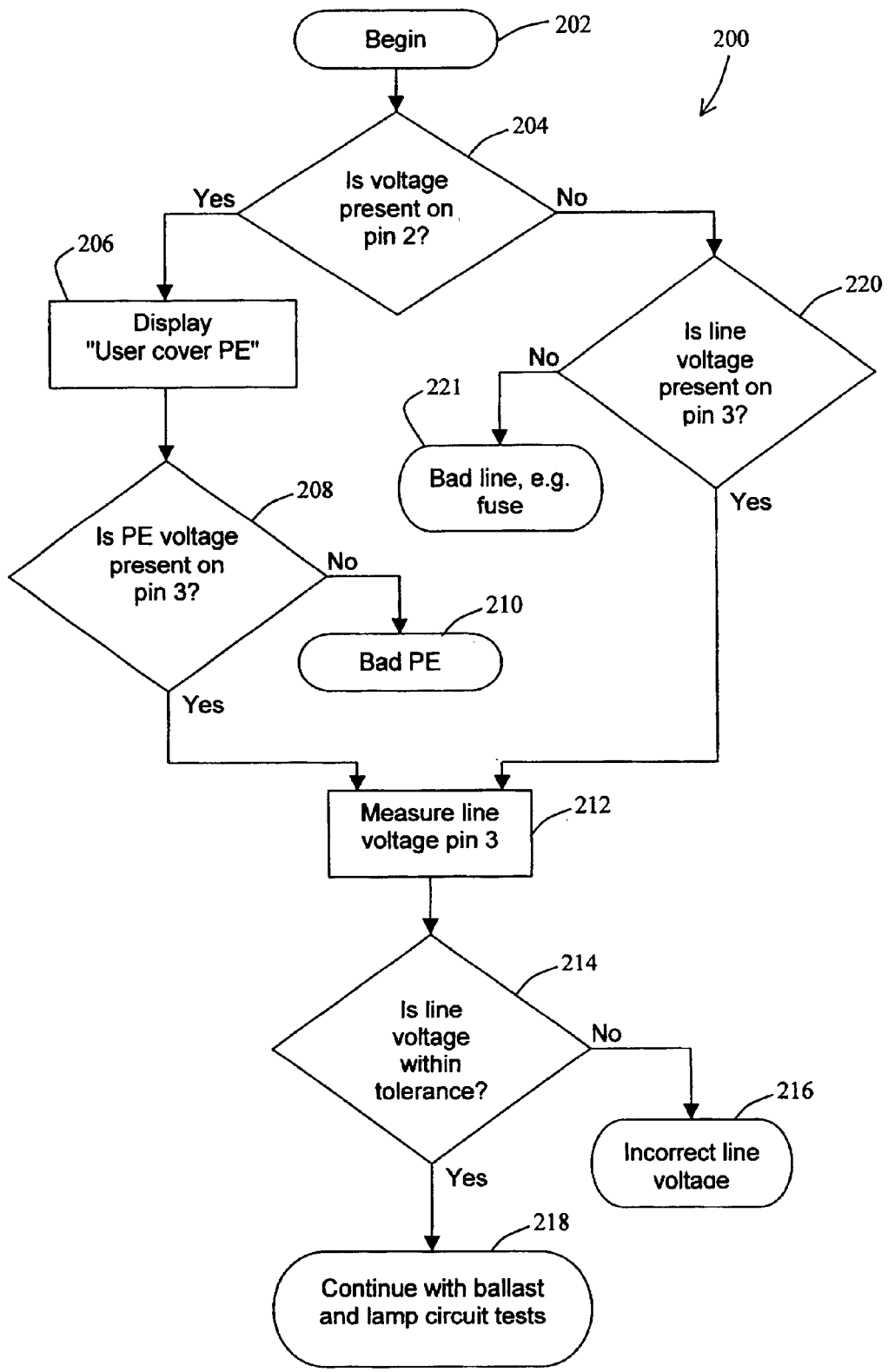
FIG. 7 is an exemplary flow chart depicting programming within the microprocessor of FIG. 6.

FIG. 7 is a flow chart depicting initial phases of a test sequence programmed within the microcontroller 132. Execution begins at 202, and then proceeds to decision step 204, where the diagnostic tester 80 first determines whether voltage is present on pin 2, which should be the case when testing a lighting fixture such as the FIG. 1 lighting fixture 10, which includes a photoelectric controller 46, and wherein the high line (HL) 30 is connected to pin 2 of connector 16. This measurement of pin 2 is made at voltage measurement point 120, via voltage conditioning circuit 176 having its output connected via multiplexer 154 to the analog input 142 of the microcontroller 132.

If the answer in decision box 204 is "yes," then execution proceeds to box 206, where the user is prompted, via the display 138, to cover the photoelectric sensing device of the photoelectric controller 34, thereby simulating nighttime conditions. If the photoelectric controller 34 is operating, then high line voltage should appear at the output 40 of the photoelectric controller 34, and be conducted to pin 3 of connector 16.

Thus, in decision box 208 the diagnostic tester 80 determines, through the voltage measurement point 122 via the voltage conditioning circuit 178 having its output connected via multiplexer 154 to the analog input 142 of the microcontroller 132, whether voltage is present on pin 3.

If the answer in decision box 208 is "no," then execution proceeds to box 210, which effectively terminates testing until the photoelectric controller 34 is replaced. Thus, the user is prompted via the display 134 to replace the photoelectric controller 34 before testing continues.

If the answer in decision box 208 is "yes," then execution proceeds to box 212, where the diagnostic tester 80 measures the line voltage on pin 3 at voltage measurement point 122 via the voltage conditioning circuit 178. In decision box 214, the measured input line voltage is compared to the reference line voltage. If measured line voltage is not within tolerance, then the output of decision box 214 is "no," and execution proceeds to box 216 where in incorrect line voltage is noted, rendering further diagnostic testing uncertain until the line voltage is corrected.

If the measured line voltage is within tolerance, then the answer in decision box 214 is "yes," and execution proceeds to 218 where further testing is performed as described hereinbelow with reference to FIGS. 8 and 9.

Still considering the flow chart of FIG. 7, if in decision box 204 the answer is "no," because there is no voltage on pin 2 of connector 16, execution proceeds to decision box 220 where it is determined whether voltage is present on pin 3 of connector 16. If the answer is "no," then execution proceeds to 221 indicating that no line voltage is present which may be caused, for example, by a blown fuse.

If in decision box 220 it is determined that line voltage is present on pin 3, then execution proceeds to box 212, described hereinabove.

Referring finally to FIGS. 8 and 9, shown is a program flow chart 240 for ballast and lamp circuit tests, executed by the microcontroller 132. The test sequence of the flow chart of FIGS. 8 and 9 follows that of the flow chart of FIG. 7, and is entered in box 242.

The flow chart of FIG. 8 assumes that the optional controlled switching element 102 is present for in effect disconnecting the lamp 44 from the circuit. However, alternative test sequences are possible, described hereinbelow, which take advantage of hot restart characteristics of HID lamps. Such alternative test sequences do not require the controlled switching element 102.

In box 244, the lamp is disconnected via the controlled switching element 102. In box 246, ballast open circuit output voltage is measured via voltage measurement point 124 comprising voltage conditioning circuit 180 connected to input 156 of multiplexer 150.

In decision box 248 the measured ballast open circuit output voltage is compared to the reference ballast open circuit voltage. If not within tolerance, then the output of decision box 248 is "no," and execution proceeds to 250, where a bad ballast is indicated.

If the decision of box 248 is "yes," then execution proceeds to box 252 where the ballast output is shunted by activating switching element 110, switching shunt resistor 108 into the circuit. Ballast current is measured in Box 254 as a voltage drop across the shunt resistor 108, again employing voltage measurement point 124 comprising voltage conditioning circuit 176, and converted to current by Ohm's law.

In decision box 256, it is determined whether ballast current is within tolerance. If the answer is "no," then execution proceeds to 258, where a likely bad capacitor is indicated.

If the output of decision box 256 is "yes," then execution proceeds to box 260 of FIG. 9 where the shunt resistor 108 is removed from the circuit by opening the controlled switching element 110.

In decision box 262 ignitor voltage is measured, with the lamp 44 still disconnected from the circuit. The ignitor voltage is measured at voltage measurement point 126 via pulse conditioning circuit 178, and analog input 140 of the microcontroller 132.

In decision box 264 it is determined whether the ignitor voltage is within tolerance. If "no," then a bad ignitor is indicated, and execution proceeds to box 266.

If the ignitor voltage is within tolerance, then execution proceeds to box 268, where the lamp is reconnected in the circuit by activating controlled switching element 102, and allowed to start. After a suitable warmup time, in decision box 270 lamp voltage is measured, again employing voltage measurement point 124 comprising voltage conditioning circuit 176.

In decision box 272, it is determined whether the lamp voltage is within tolerance. If the answer is "no," then execution proceeds to box 274 indicating a bad lamp. If the answer if "yes," then the test sequence ends at 276, with no particular problem found.

As noted above, the controlled switching circuit 102 which opens the circuit to the lamp may be omitted by utilizing hot restart characteristics of the HID lamp 44. Thus, if an HID lamp has reached operating temperature and is then turned off, the lamp will not start again until it has cooled sufficiently to allow restart from ignitor pulses. A lamp which has just been turned off and is still hot is effectively an open circuit.

Thus, another test sequence, assuming the lamp is operating, is to first energize the lamp 56. In addition, if desired, the lamp voltage is measured to determine whether it is within tolerance.

After the lamp has operated for at least four minutes and accordingly is sufficiently hot so as to effectively present an open circuit when first turned off, the shunt resistor 108 is switched in by activating the relay 110, allowing ballast current to be measured. After ballast current is measured, but while the lamp 44 is still hot, the shunt is removed by de-activating the relay 110. Under these conditions, the lamp 44 effectively represents an open circuit, allowing both ballast open circuit output voltage and ignitor voltage to be tested.

In yet another test sequence, the lamp 44 is initially operated for at least four minutes. Then the lamp 44 is turned off by turning off the triac 100, interrupting power to the ballast 20. Power is quickly re-applied by turning on the triac 100. Ballast open circuit voltage and ignitor voltage are measured while the lamp 44 is still hot, and effectively represents an open circuit.

The invention is thus embodied in an automated diagnostic tester system for use with a lighting fixture connected to a power source and including a ballast connected to the power source, a capacitor connected to the ballast, an ignitor, and a high intensity discharge lamp connected to the ballast. A photoelectric switch may also be included. The automated tester system includes an electrical connector system that connects to the lighting fixture. The connection system provides circuit access at least to one of the power source and to the high intensity discharge lamp, enabling interruption of either the connection of the ballast to the power source or the connection of the high intensity discharge lamp to the ballast, or both. An automated diagnostic tester is connected to the electrical connector system and is operable to automatically measure lighting fixture parameters including at least one of a power source voltage, ballast open circuit output voltage, ballast output current, ignitor pulse voltage and lamp operating voltage. In the event the lighting fixture includes a photoelectric switch controlling the electrical connection of the ballast transformer to the power source, the automated diagnostic tester is operable to also automatically measure output voltage of the photoelectric switch.

The automated diagnostic tester includes a display device and, in one mode of operation, displays measured parameter values on the display device. In another mode of operation, the automated diagnostic tester, based on measured parameter values, logically diagnoses a likely faulty component. The automated diagnostic tester includes an input device for inputting nominal parameter values for a particular lighting fixture to facilitate diagnosis. The nominal parameter values are inputted in coded form and include power source voltage, lamp voltage, ballast open circuit voltage, ballast current and ignitor voltage.

The electrical connector system includes a pair of mating connectors included as part of the lighting fixture, and the pair of mating connectors are connected to each other for normal operation of the lighting fixture. The automated diagnostic tester system includes a "Y"-connected cable having one connector connected to the automated diagnostic tester and a pair of cable connectors for connection to the pair of mating connectors included as part of the lighting fixture.

While specific embodiments of the invention have been illustrated and described herein, it is realized that numerous modifications and changes will occur to those skilled in the art.

What is claimed is:

1. An automated diagnostic tester system for use with a lighting fixture connected to a power source and including at least one of a ballast connected to the power source, a capacitor connected to the ballast, an ignitor, and a high intensity discharge lamp connected to the ballast, the automated diagnostic tester system comprising:

an electrical connector system interconnected to the lighting fixture to provide access to at least the power source and to the high intensity discharge lamp, and enabling interruption of at least one of (i) the connection of the ballast to the power source and (ii) the connection of the high intensity discharge lamp to the ballast; and an automated diagnostic tester connected to said electrical connector system and operable to automatically measure lighting fixture parameters including at least one of power source voltage, ballast open circuit output voltage, ballast output current, ignitor pulse voltage and lamp operating voltage, wherein the lifting fixture includes a photoelectric switch controlling the electrical connection of the ballast transformer to the power source, and wherein the automated diagnostic tester is operable to automatically measure output voltage of the photoelectric switch.

2. The automated diagnostic tester system of claim 1, wherein the automated diagnostic tester includes a display device to display measured parameter values.

3. The automated diagnostic tester system of claim 1, wherein the automated diagnostic tester logically diagnoses a faulty component based on measured parameter values.

4. The automated diagnostic tester system of claim 3, wherein the automated diagnostic tester includes an input device for inputting nominal parameter values for a particular lighting fixture to facilitate diagnosis.

5. The automated diagnostic tester system of claim 4, wherein the nominal parameter values are inputted in coded form and includes at least one of power source voltage, lamp voltage, ballast open circuit voltage, ballast output current and ignitor voltage.

6. The automated diagnostic tester system of claim 5, wherein the electrical connector system includes a "Y"-connected cable having one connector connected to said automated diagnostic tester and a pair of cable connectors for connection to a pair of mating connectors included as part of the lighting fixture.

7. The automated diagnostic tester system of claim 1, wherein the automated diagnostic tester includes a controlled switching element connected so as to enable controlled interruption of the circuit of the ballast winding to the power source as passed through the photoelectric switch.

8. The automated diagnostic tester system of claim 1, wherein the automated diagnostic tester is a handheld battery powered device.

9. The automated diagnostic tester system of claim 1, wherein the automated diagnostic tester is self-calibrating.

10. In a lighting fixture having a high intensity discharge lamp, a ballast connected to a power source, and the high intensity discharge lamp connected to the ballast, a method of testing the lighting fixture with an automated diagnostic testing system comprising:

providing, access to circuitry of the lighting fixture, by an electrical connector system, the circuit access being to at least the power source and to the high intensity discharge lamp;

connecting an automated diagnostic tester to the electrical connector system;

enabling controlled interruption, through the connector system, including a controlled switching element of at least one circuit connection selected from the group consisting of the connection of the ballast to the power source and the connection of the high intensity discharge lamp to the ballast, wherein the controlled interruption of the circuit of the ballast to the power source as passed through a photoelectric switch; and operating the automated diagnostic tester to automatically measure lighting fixture parameters including at least one of a power source voltage, ballast open circuit output voltage, ballast output current, ignitor pulse voltage and lamp operating voltage.

11. The method according to claim 10, wherein said automated diagnostic tester diagnoses faults at a component level, based on measured parameter values.

12. The method of claim 11, wherein said automated diagnostic tester includes an input device for inputting nominal parameter values for a particular lighting fixture to facilitate diagnosis.

13. The method of claim 12, wherein the nominal parameter values are inputted in coded form and include at least one of power source voltage, lamp voltage, ballast open circuit voltage, ballast current and ignitor voltage.

14. The method of claim 10, which further includes a "Y"-connected cable having one connector connected to said automated diagnostic tester and a pair of cable connectors for connection to said pair of mating connectors included as part of the lighting fixture.

15. The method according to claim 10 wherein the automated diagnostic tester is configured to be handheld.

16. The method according to claim 10 wherein the automated diagnostic tester is configured to be battery operated.

17. The method according to claim 10, wherein the automated diagnostic tester includes a step of displaying on a display device measured parameter values.

18. In a lighting fixture having a high intensity discharge lamp, a ballast connected to a power source, and the high intensity discharge lamp connected to the ballast, a method of testing the lighting fixture with an automated diagnostic testing system comprising:

providing, access to circuitry of the lighting fixture, by an electrical connector system, the circuit access being to at least the power source and to the high intensity discharge lamp;

connecting an automated diagnostic tester to the electrical connector system;

enabling interruption, through the connector system, of at least one circuit connection selected from the group consisting of the connection of the ballast to the power source and the connection of the high intensity discharge lamp to the ballast;

operating the automated diagnostic tester to automatically measure lighting fixture parameters including at least one of a power source voltage, ballast open circuit output voltage, ballast output current, igniter pulse voltage and lamp operating voltage; and configuring the lighting fixture to include a photoelectric switch controlling the electrical connection of the ballast to the power source, and wherein said automated diagnostic tester is operable to also automatically measure output voltage of the photoelectric switch.

19. An automated diagnostic tester system for use with a lighting fixture connected to a power source and including at least one of a ballast connected to the power source, a capacitor connected to the ballast, an igniter, and a high intensity discharge lamp connected to the ballast, the automated diagnostic tester system comprising:

an electrical connector system interconnected to the lighting fixture to provide access to at least the power source and to the high intensity discharge lamp, and enabling interruption of at least one of (i) the connection of the ballast to the power source and (ii) the connection of the high intensity discharge lamp to the ballast;

an automated diagnostic tester connected to said electrical connector system and operable to automatically measure lighting fixture parameters including at least one of power source voltage, ballast open circuit output voltage, ballast output current, igniter pulse voltage and lamp operating voltage;

a display of the automated diagnostic tester to display the measured parameter values; and an input device of the automated diagnostic tester for inputting nominal parameter values for a particular lighting fixture to facilitate diagnosis.

20. The system of claim 19, wherein the inputting device is configured to input a plurality of distinct values for a particular parameter.

21. An automated diagnostic tester system for use with a lighting fixture connected to a power source and including at least one of a ballast connected to the power source, a capacitor connected to the ballast, an igniter, and a high intensity discharge lamp connected to the ballast, the automated diagnostic tester system comprising:

an electrical connector system interconnected to the lighting fixture to provide access to at least the power source and to the high intensity discharge lamp, and enabling interruption of at least one of (i) the connection of the ballast to the power source and (ii) the connection of the high intensity discharge lamp to the ballast;

an automated diagnostic tester connected to said electrical connector system and operable to automatically measure lighting fixture parameters including at least one of power source voltage, ballast open circuit output voltage, ballast output current, igniter pulse voltage and lamp operating voltage; and a memory storage of the automated diagnostic tester; which stores a plurality of lighting fixture reference parameters, which are selectively compared to the measured lighting fixture parameters to diagnose a faulty component.

* * * * *